United States Patent
Zhao et al.

(10) Patent No.: US 11,362,040 B2
(45) Date of Patent: Jun. 14, 2022

(54) ARRAY SUBSTRATE, METHOD FOR MANUFACTURING THE SAME AND DISPLAY DEVICE

(71) Applicants: BOE Technology Group Co., Ltd., Beijing (CN); Ordos Yuansheng Optoelectronics Co., Ltd., Inner Mongolia (CN)

(72) Inventors: Yanyan Zhao, Beijing (CN); Fuqiang Tang, Beijing (CN); Jingyi Xu, Beijing (CN); Yuelin Wang, Beijing (CN); Yezhou Fang, Beijing (CN)

(73) Assignees: BOE TECHNOLOGY GROUP CO., LTD., Beijing (CN); ORDOS EQUIPMENT MANUFACTURING BASE, DONGSHENG, Inner Mongolia (CN)

( * ) Notice: Subject to any disclaimer, the term of this patent is extended or adjusted under 35 U.S.C. 154(b) by 184 days.

(21) Appl. No.: 16/148,049

(22) Filed: Oct. 1, 2018

(65) Prior Publication Data

US 2019/0304925 A1    Oct. 3, 2019

(30) Foreign Application Priority Data

Mar. 28, 2018   (CN) .......................... 201810264551.7

(51) Int. Cl.
*H01L 23/552*    (2006.01)
*H01L 27/02*    (2006.01)
(Continued)

(52) U.S. Cl.
CPC ........ *H01L 23/552* (2013.01); *H01L 27/0296* (2013.01); *H01L 27/124* (2013.01); *H01L 27/1259* (2013.01); *G02F 1/13454* (2013.01)

(58) Field of Classification Search
CPC . H01L 23/552; H01L 27/0296; H01L 27/124; H01L 27/1259; H01L 27/0288;
(Continued)

(56) References Cited

U.S. PATENT DOCUMENTS 9,431,433 B2    8/2016  Xia et al.
2015/0294987 A1  10/2015  Xia et al.
(Continued)

FOREIGN PATENT DOCUMENTS

CN    202771135 U    3/2013
CN    103926732 A    7/2014
(Continued)

OTHER PUBLICATIONS

First Office Action, including Search Report, for Chinese Patent Application No. 201810264551.7, dated Jul. 13, 2020, 16 pages.

*Primary Examiner* — Syed I Gheyas
(74) *Attorney, Agent, or Firm* — Westman, Champlin & Koehler, P.A.

(57) ABSTRACT

An array substrate, a display device and a method for manufacturing the array substrate are provided. The array substrate includes a display region and a peripheral wiring region, wherein the array substrate includes: a base substrate; a peripheral circuit in the peripheral wiring region and on the base substrate; and an electrostatic shielding layer disposed over the peripheral circuit and the base substrate.

17 Claims, 6 Drawing Sheets

(51) Int. Cl.
*H01L 27/12* (2006.01)
*G02F 1/1345* (2006.01)

(58) Field of Classification Search
CPC .............. H01L 27/1244; H01L 27/1296; G02F 1/13454; G02F 1/13439; G02F 1/136204; G02F 1/134309; G02F 1/1333; H05F 1/00
See application file for complete search history.

(56) References Cited

U.S. PATENT DOCUMENTS

2016/0291430 A1* 10/2016 Sun .................. G02F 1/136204
2017/0363921 A1    12/2017 Kum et al.
2019/0163001 A1*  5/2019 Gong ................. G06F 3/04184

FOREIGN PATENT DOCUMENTS

| CN | 104698710 A | 6/2015 |
| CN | 107065365 A | 8/2017 |
| CN | 107092400 A | 8/2017 |

* cited by examiner

ARRAY SUBSTRATE, METHOD FOR MANUFACTURING THE SAME AND DISPLAY DEVICE

CROSS-REFERENCE TO RELATED APPLICATION

This application claims the benefit of Chinese Patent Application No. 201810264551.7 filed on Mar. 28, 2018 in the State Intellectual Property Office of China, the whole disclosure of which is incorporated herein by reference.

TECHNICAL FIELD

The present disclosure relates to the field of display technologies, and in particular, to an array substrate, a method for manufacturing the array substrate and a display device.

BACKGROUND

A gate driver on array (abbreviated as GOA) technology is a technology for integrating a gate drive integrated circuit, for example, of a liquid crystal display, on an array substrate. However, the existing GOA technology usually results in a low product yield of display panel, thus there is an improvement room for the GOA technology.

SUMMARY

In an aspect, it is provided an array substrate including a display region and a peripheral wiring region, wherein the array substrate includes: a base substrate; a peripheral circuit in the peripheral wiring region and on the base substrate; and an electrostatic shielding layer disposed over the peripheral circuit and the base substrate.

Optionally, the electrostatic shielding layer includes: a first conductive layer on a side of the peripheral circuit away from the base substrate; an insulating layer on the first conductive layer; and a second conductive layer on the insulating layer, the second conductive layer including a connecting portion electrically connected to the first conductive layer.

Optionally, an orthographic projection of the connecting portion on the base substrate is annular.

Optionally, an enclosed space is formed between the first conductive layer and the second conductive layer and is filled with at least a part of the insulating layer.

Optionally, a groove is formed in the insulating layer to expose the first conductive layer, and at least a part of the connecting portion is located in the groove to be electrically connected to the first conductive layer.

Optionally, the array substrate may further include a display circuit in the display region, wherein the display circuit includes a first functional electrode in the same layer as the first conductive layer.

Optionally, the display circuit further includes a second functional electrode in the same layer as the second conductive layer.

Optionally, the second conductive layer is isolated from the second functional electrode, and the second functional electrode includes a plurality of sub-electrodes spaced apart from each other.

Optionally, the first functional electrode is one of a pixel electrode and a common electrode, and the second functional electrode is the other of the pixel electrode and the common electrode.

Optionally, the array substrate may further include an electrostatic discharge circuit electrically connected to the electrostatic shielding layer.

Optionally, the electrostatic discharge circuit includes a first electrostatic discharge site and a second electrostatic discharge site that are spaced apart from each other, and a combined orthographic projection of the first electrostatic discharge site, the second electrostatic discharge site and the connecting portion on the base substrate is annular.

Optionally, the combined orthographic projection of the first electrostatic discharge site, the second electrostatic discharge site and the connecting portion on the base substrate is a closed loop.

In another aspect, it is provided a display device including the array substrate as described above.

In a further aspect, it is provided a method for manufacturing an array substrate including a display region and a peripheral wiring region, wherein the method includes:
providing a base substrate;
forming a peripheral circuit on the base substrate and in the peripheral wiring region; and
forming an electrostatic shielding layer disposed over the peripheral circuit and the base substrate.

Optionally, the step of forming the electrostatic shielding layer on the side of the peripheral circuit away from the base substrate includes:
forming a first conductive layer on the side of the peripheral circuit away from the base substrate;
forming an insulating layer on the first conductive layer; and
forming a second conductive layer on the insulating layer in such a way that the second conductive layer includes a connecting portion electrically connected to the first conductive layer.

Optionally, an orthographic projection of the connecting portion on the base substrate is annular.

Optionally, the step of forming the second conductive layer on the insulating layer in such a way that the second conductive layer includes the connecting portion electrically connected to the first conductive layer includes:
forming a groove in the insulating layer to expose the first conductive layer; and
forming the second conductive layer on the insulating layer with the groove such that at least a part of the connecting portion of the second conductive layer is formed in the groove to be electrically connected to the first conductive layer.

Optionally, the step of forming the first conductive layer on the side of the peripheral circuit away from the base substrate includes:
forming a first functional electrode of a display circuit in the display region and forming the first conductive layer on the side of the peripheral circuit away from the base substrate through the same first patterning process.

Optionally, the step of forming the second conductive layer on the insulating layer includes:
forming a second functional electrode of the display circuit in the display region and forming the second conductive layer on the insulating layer through the same second patterning process.

Optionally, the first functional electrode is one of a pixel electrode and a common electrode, and the second functional electrode is the other of the pixel electrode and the common electrode.

BRIEF DESCRIPTION OF THE DRAWINGS

Various advantages and benefits will become apparent to those skilled in the art from detailed descriptions of the following embodiments. The accompanying drawings are only for the purpose of illustrating the embodiments and are not to be construed as limiting the present disclosure. Throughout the drawings, the same components are denoted by the same reference numerals. In the drawing.

DETAILED DESCRIPTION OF EMBODIMENTS

Specific embodiments, structures, features and effects of an array substrate, a method for manufacturing the array substrate and a display device according to the present disclosure will be described in detail below with reference to the accompanying drawings and embodiments. In the following descriptions, "one embodiment" or "an embodiment" in different paragraphs does not necessarily mean the same embodiment. Furthermore, the features, structures or characteristics of one or more embodiment may be combined in any suitable manner.

The inventor has found that: a GOA circuit is arranged on a side of a display region of a display panel and has a plurality of cascaded GOA units, a peripheral wiring region where the GOA circuit is located has a higher capacitance value than the display region and an electric field generated in the periphery wiring region is larger than an electric field generated in the display region since the GOA circuit has a large wiring density, thereby resulting in poor uniformity of the capacitance values between the periphery wiring region and the display region of the display panel, so that the product yield of the display panel is low.

In a method for manufacturing an array substrate provided by an embodiment of the present disclosure, an electrostatic shielding layer is formed on a side of a peripheral circuit to reduce an outward-radiated electric field of the peripheral circuit and uniformize capacitance detections between the display region and the peripheral wiring region, thereby improving the product yield of the array substrate.

Figure 1:
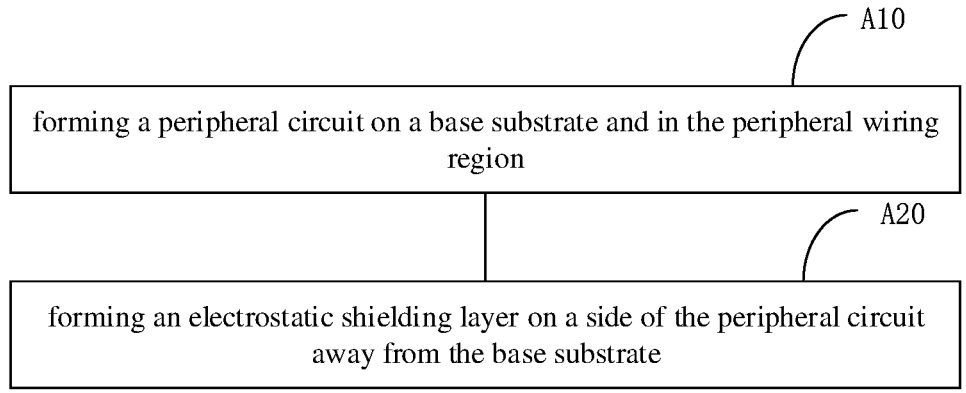
FIG. 1 is a schematic flow chart of a method for manufacturing an array substrate according to an embodiment of the present disclosure.
Figure 2:
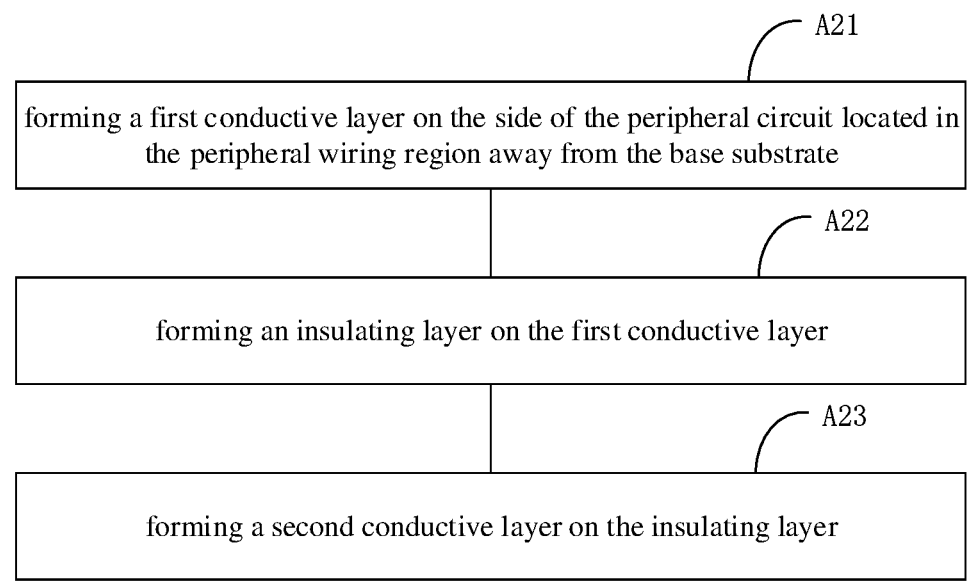
FIG. 2 is a schematic flow chart of a step of forming an electrostatic shielding layer in a method for manufacturing an array substrate according to an embodiment of the present disclosure.

FIG. 1 is a flow chart of a method for manufacturing an array substrate according to an embodiment of the present disclosure. Referring to FIG. 1, the array substrate may include a display region and a peripheral wiring region. The method for manufacturing the array substrate may include:

A10. forming a peripheral circuit on a base substrate and in the peripheral wiring region; and A20. forming an electrostatic shielding layer on a side of the peripheral circuit away from the base substrate.

For example, the display region and the peripheral wiring region of the array substrate are adjacent to each other, and the peripheral wiring region is located at the periphery of the display region, for example, to form a semi-enclosed region for the display region.

The electrostatic shielding layer, the peripheral circuit and the base substrate may be sequentially stacked. Specifically, the electrostatic shielding layer is disposed over a top surface of the peripheral circuit, and the top surface of the peripheral circuit faces away from the base substrate.

The electrostatic shielding layer is formed on the side of the peripheral circuit to reduce the outward-radiated electric field of the peripheral circuit and uniformize capacitance detections between the display region and the peripheral wiring region, thereby improving the product yield of the array substrate.

The peripheral wiring region may be a region where an electronic device generating an electromagnetic field after being energized is located, such as a GOA region, and the peripheral circuit in the peripheral wiring region may include a GOA circuit.

Figure 3:
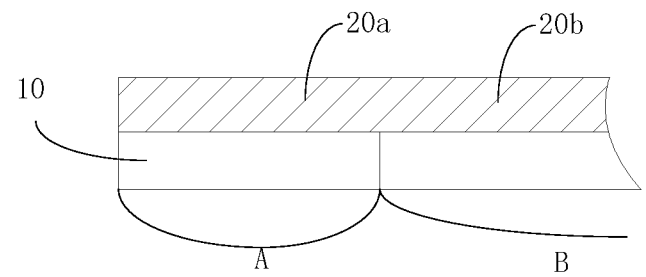
FIG. 3 is a schematic view of a structure formed after some steps of a method for manufacturing an array substrate according to an embodiment of the present disclosure are performed.
Figure 4:
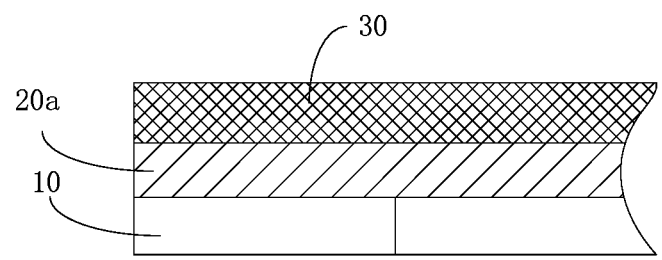
FIG. 4 is a schematic view of a structure formed after some steps of a method for manufacturing an array substrate according to an embodiment of the present disclosure are performed.

FIG. 2 to FIG. 7 illustrate a step of forming an electrostatic shielding layer in a method for manufacturing an array substrate according to an embodiment of the present disclosure. Referring to FIG. 2 to FIG. 7, the step A20 may specifically include:

A21. forming a first conductive layer 20a on the side of the peripheral circuit 10 located in the peripheral wiring region A away from the base substrate, as shown in FIG. 3;

A22. forming an insulating layer 30 on the first conductive layer 20a, as shown in FIG. 4; and A23. forming a second conductive layer 40a on the insulating layer 30.

Figure 7:
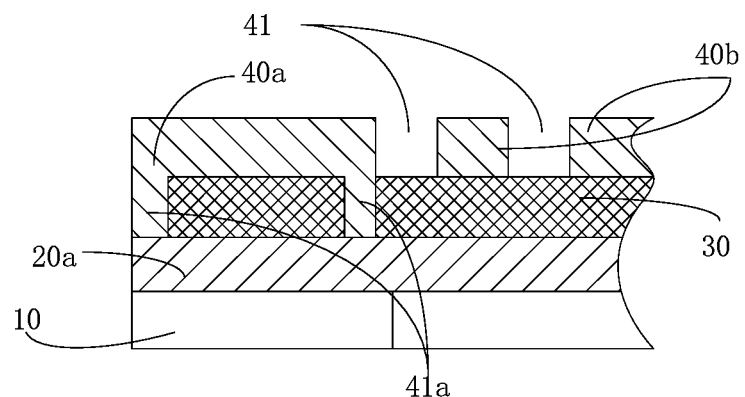
FIG. 7 is a schematic view of a structure formed after some steps of a method for manufacturing an array substrate according to an embodiment of the present disclosure are performed.

As shown in FIG. 7, the second conductive layer 40a includes a connecting portion 41a, and the connecting portion 41a is electrically connected to the first conductive layer 20a.

Figure 9:
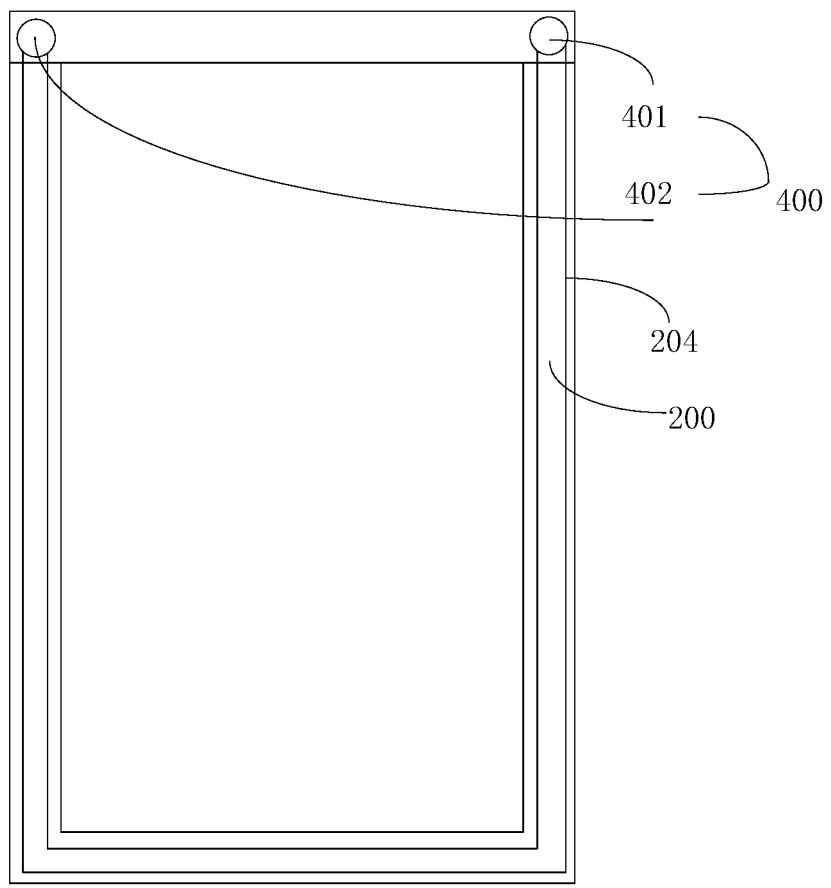
FIG. 9 is a plan view of an array substrate according to an embodiment of the present disclosure.
Figure 10:
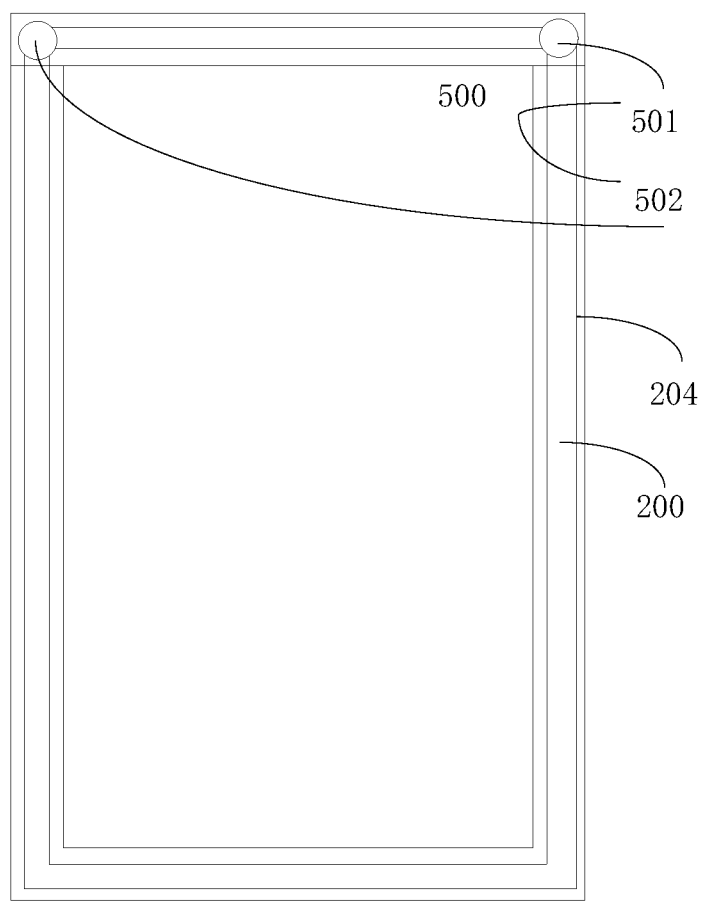
FIG. 10 is a plan view of an array substrate according to an embodiment of the present disclosure.

Optionally, an orthographic projection of the connecting portion 40a on the base substrate may be annular, as shown in FIG. 9 and FIG. 10. For example, the annular connecting portion may be a closed loop or an open loop, and the annular connecting portion may surround the periphery of the display region.

For example, examples of the material of the insulating layer include silicon nitride ($SiN_x$), silicon oxide ($SiO_x$), aluminum oxide ($Al_2O_3$), aluminum nitride (AlN) or other suitable materials such as an organic resin material. For example, the insulating layer may have a single layer structure composed of silicon nitride or silicon oxide, or a two-layer structure composed of silicon nitride and silicon oxide.

The first conductive layer 20a, the insulating layer 30 and the second conductive layer 40a may be formed by deposition or the like.

Figure 5:
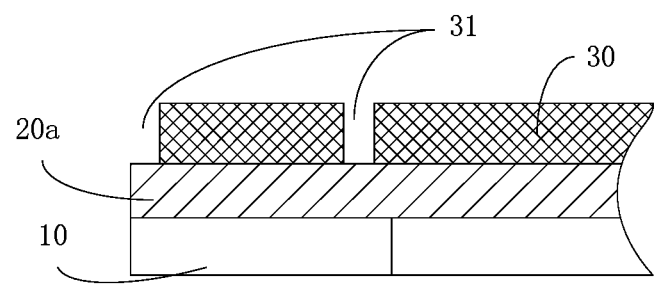
FIG. 5 is a schematic view of a structure formed after some steps of a method for manufacturing an array substrate according to an embodiment of the present disclosure are performed.

In a specific implementation, the step of forming the second conductive layer 40a on the insulating layer 30 may specifically include: forming a groove 31 in the insulating layer 30 to expose the first conductive layer 20a, as shown in FIG. 5; and forming the second conductive layer 40a on the insulating layer 30 in which the groove 31 is formed such that at least a part of the connecting portion 41a of the second conductive layer 40a is formed in the groove 31 to be electrically connected to the first conductive layer 20a, as shown in FIG. 7.

Optionally, the groove 31 may be formed at an outer edge of the peripheral circuit 10.

Optionally, in the method for manufacturing the array substrate according to an embodiment of the present disclosure, in particular, in the process of forming the electrostatic shielding layer, a display circuit in the display region may be simultaneously formed to simplify the manufacturing process of the array substrate.

For example, in some embodiments, the step of forming the first conductive layer 20a on the side of the peripheral circuit 10 away from the base substrate includes: forming a first functional electrode 20b of the display circuit in the display region B and forming the first conductive layer 20a on the side of the peripheral circuit 10 away from the base substrate through the same first patterning process.

The first functional electrode 20b and the first conductive layer 20a may be formed in the same layer from the same material by deposition. For example, the first functional electrode 20b may serve as a pixel electrode of the display circuit, the first functional electrode 20b and the first conductive layer 20a may be formed from indium tin oxide (abbreviated as ITO) such as C-ITO. The first conductive layer 20a may cover the peripheral circuit 10.

In some embodiments, the step of forming the second conductive layer 40a on the insulating layer 30 may specifically include: forming a second functional electrode 40b of the display circuit in the display region B and forming the second conductive layer 40a on the insulating layer 30 through the same second patterning process.

The second functional electrode and the second conductive layer may be formed from the same material. For example, the second functional electrode may serve as a common electrode of the display circuit, the second functional electrode and the second conductive layer may be formed from indium tin oxide (abbreviated as ITO) such as P-ITO or a graphene conductor. The second conductive layer may be specifically formed, for example, by deposition, which is not specifically limited in the embodiment of the present disclosure. The second functional electrode and the second conductive layer may be the same conductive layer which may serve as both the second functional electrode of the display circuit and a part of the electrostatic shielding layer.

Figure 6:
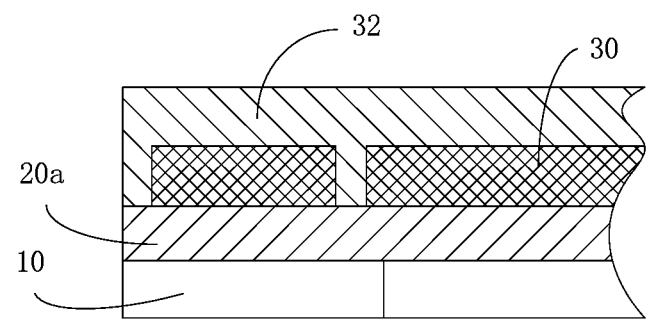
FIG. 6 is a schematic view of a structure formed after some steps of a method for manufacturing an array substrate according to an embodiment of the present disclosure are performed.

In some embodiments, the step of forming the second functional electrode 40b of the display circuit in the display region B and forming the second conductive layer 40a on the insulating layer 30 through the same second patterning process may include: forming a groove 31 in the insulating layer 30 within the peripheral wiring region A to expose the first conductive layer 20a, as shown in FIG. 5; forming a conductive layer 32 to be processed on the insulating layer 30 with the groove 31 such that at least a part of a connecting portion of the conductive layer 32 to be processed is formed in the groove 31 to be electrically connected to the first conductive layer 20a, as shown in FIG. 6; forming a groove 41 in the conductive layer 32 to be processed within the display region B such that the conductive layer 32 to be processed is divided into the second functional electrode 40b in the display region B and the second conductive layer 40a in the peripheral wiring region A, as shown in FIG. 7.

It is possible to form plural grooves 41 in the conductive layer 32 to be processed such that the conductive layer 32 to be processed is divided into a plurality of the second functional electrodes 40b in the display region B.

In the above embodiments, the electrostatic shielding layer and the display circuit may be simultaneously formed through the same patterning process, thereby saving the process time, simplifying the manufacturing process of the array substrate and reducing the manufacturing cost of the array substrate.

In some other embodiments, they are not limited to that the first functional electrode is the pixel electrode and the second functional electrode is the common electrode. Alternatively, the first functional electrode may be the common electrode and the second functional electrode may be the pixel electrode.

In the array substrate according to the embodiment of the present disclosure, the electrostatic shielding layer is formed on the side of the peripheral circuit to reduce the outward-radiated electric field of the peripheral circuit and uniformize capacitance detections between the display region and the peripheral wiring region, thereby improving the product yield of the array substrate.

Figure 8:
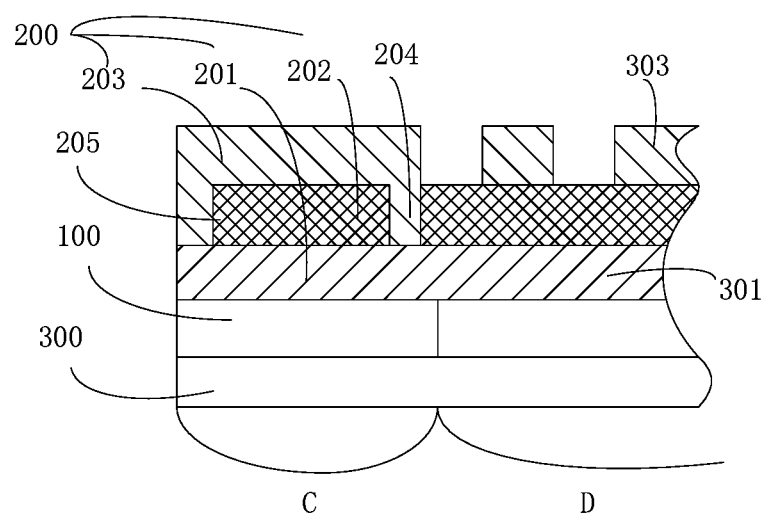
FIG. 8 is a schematic structural view of an array substrate according to an embodiment of the present disclosure.

FIG. 8 is a schematic view of an array substrate according to an embodiment of the present disclosure. Referring to FIG. 8, an array substrate according to an embodiment of the present disclosure may include a peripheral wiring region C and a display region D. The array substrate further includes: a base substrate 300; a peripheral circuit 100 in the peripheral wiring region C and on the base substrate 300; and an electrostatic shielding layer 200 on a side of the peripheral circuit 100 away from the base substrate 300.

The electrostatic shielding layer is formed on the side of the peripheral circuit away from the base substrate to reduce the outward-radiated electric field of the peripheral circuit and uniformize capacitance detections between the display region and the peripheral wiring region, thereby improving the product yield of the array substrate.

Optionally, the display region D and the peripheral wiring region C are adjacent to each other, and the peripheral wiring region C is located at the periphery of the display region D. The electrostatic shielding layer 200, the peripheral circuit 100 and the base substrate 300 may be sequentially stacked. Specifically, the electrostatic shielding layer 200 is disposed over a top surface of the peripheral circuit 100, and the top surface of the peripheral circuit 100 faces away from the base substrate 300.

In some embodiments, the electrostatic shielding layer 200 includes: a first conductive layer 201 on the side of the peripheral circuit 100 away from the base substrate 300; an insulating layer 202 on the first conductive layer 201; and a second conductive layer 203 on the insulating layer 202. The second conductive layer 203 includes a connecting portion 204, and the connecting portion 204 is electrically connected to the first conductive layer 201.

For example, an enclosed space 205 for electrostatic shielding is formed between the first conductive layer 201 and the second conductive layer 203, and the enclosed space 205 may be filled with at least a part of the insulating layer 202 so that there is a support between the first conductive layer 201 and the second conductive layer 203. The enclosed space 205 may form an electrostatic shielding space that shields electromagnetic radiation from the peripheral circuit 100 in a direction facing away from the base substrate.

As shown in FIG. 9 and FIG. 10, an orthographic projection of the connecting portion 204 on the base substrate 300 is annular. For example, the connecting portion 204 may be annularly disposed around the periphery of the display region, and the annular connecting portion 204 may specifically be an open loop such as a U-shaped loop (shown in FIG. 9) or a closed loop (shown in FIG. 10).

The connecting portion 204 is electrically connected to the first conductive layer 201 by passing through the periphery of the at least a part of the insulating layer 202. In a specific implementation, the insulating layer 202 is provided with a groove to expose the first conductive layer 201, and at least a part of the connecting portion 204 is located in the groove to be electrically connected to the first conductive layer 201. An arrangement shape of the groove may match the shape of the connecting portion, for example, an orthographic projection of the groove on the base substrate is annular.

The first conductive layer 201 and the first functional electrode 301 of the display circuit in the display region D may be disposed in the same layer, and the first conductive layer 201 and the first functional electrode 301 of the display circuit in the display region D may be formed through the same first patterning process to form an integral conductive layer. For example, the first functional electrode 301 and the first conductive layer 201 may be formed in the same layer from the same material by deposition. For example, the first functional electrode 301 may serve as a pixel electrode of the display circuit, the first functional electrode 301 and the first conductive layer 201 may be formed from indium tin oxide (abbreviated as ITO) such as C-ITO. The first conductive layer 201 may cover the peripheral circuit 10.

The second conductive layer 203 and the second functional electrode 303 of the display circuit in the display region D may be located in the same layer. The second conductive layer 203 is electrically isolated from the second functional electrode 303 so that the second functional electrode 303 is electrically isolated from the first functional electrode 301 in the case where the first conductive layer 201 and the first functional electrode 301 of the display circuit in the display region is an integral conductive layer, thereby enabling the first functional electrode 301 and the second functional electrode 303 to realize respective functions. For example, the second functional electrode 303 may include a plurality of sub-electrodes spaced apart from each other, the second functional electrode 303 may serve as a common electrode of the display circuit, and the second conductive layer 203 and the second functional electrode 303 of the display circuit in the display region may be formed from indium tin oxide (abbreviated as ITO) such as P-ITO or a graphene conductor. The second conductive layer 203 and the second functional electrode 303 of the display circuit in the display region may be specially formed, for example, by sputtering, which is not specifically limited in the embodiment of the present disclosure.

In some other embodiments, they are not limited to that the first functional electrode is the pixel electrode and the second functional electrode is the common electrode. Alternatively, the first functional electrode may be the common electrode and the second functional electrode may be the pixel electrode.

In the array substrate according to the above embodiments of the present disclosure, the electrostatic shielding layer may be electrically connected to an electrostatic discharge circuit, thereby improving an electrostatic discharge capability of the array substrate.

FIG. 9 is a plan view of an array substrate according to an embodiment of the present disclosure. Referring to FIG. 9, the array substrate according to an embodiment of the present disclosure may further include an electrostatic discharge circuit 400 electrically connected to the electrostatic shielding layer 200. The electrostatic shielding layer is electrically connected to the electrostatic discharge circuit to improve the electrostatic discharge capability of the array substrate.

In the embodiment illustrated in FIG. 9, the peripheral wiring region is circumferentially disposed on a first side, a bottom side and a second side of the display region. An electrostatic discharge site of the electrostatic discharge circuit 400 may be led to a top side of the display region through a flexible circuit board or the like, and metal wirings in the electrostatic shielding layer 200 may be electrically connected to the electrostatic discharge site on the top side of the display region.

In some embodiments, the electrostatic discharge circuit 400 includes a first electrostatic discharge site 401 and a second electrostatic discharge site 402 that are spaced apart from each other. A combined orthographic projection of the first electrostatic discharge site 401, the second electrostatic discharge site 402 and the connecting portion 204 on the base substrate 300 is an open loop.

The static electricity in the electrostatic shielding layer may be quickly discharged from one of the first electrostatic discharge site 401 and the second electrostatic discharge site 402 which has a relatively short distance from the static electricity. Meanwhile, the array substrate may still have good electrostatic discharge capability even if the first electrostatic discharge site 401 or the second electrostatic discharge site 402 is in poor contact.

As shown in FIG. 10, in the array substrate according to the embodiment of the present disclosure, the electrostatic discharge circuit 500 may include a first electrostatic discharge site 501 and a second electrostatic discharge site 502 which are spaced apart from each other. A combined orthographic projection of the first electrostatic discharge site 501, the second electrostatic discharge site 502 and the connecting portion 204 on the base substrate 300 is a closed loop.

When the first electrostatic discharge site 501 is in poor contact, the static electricity on the closed loop may be discharged from the second electrostatic discharge site 502 in a good contact in a path close to the second electrostatic discharge site 502. Therefore, the array substrate may still have good electrostatic discharge capability even if the first electrostatic discharge site 501 or the second electrostatic discharge site 502 is in poor contact.

An embodiment of the present disclosure further provides a display device including any of the array substrates according to the above embodiments. The display device may be any product or component having a display function such as a display panel, an electronic paper, a mobile phone, a tablet computer, a television, a display, a notebook computer, a digital photo frame, a navigator, and the like.

In the display device according to the embodiment of the present disclosure, the capacitance detections between the display region and the peripheral wiring region is uniformized, thereby improving the product yield of the display device.

In the above embodiments, the descriptions of the various embodiments may focus on various aspects, and any parts that are not described in detail in a certain embodiment may refer to related descriptions in other embodiments.

It will be appreciated that related features in the above described devices may be referenced to each other. In addition, "first", "second" and the like in the above embodiments are only used to distinguish the components.

In the specification, numerous specific details are set forth. However, it is understood that the embodiments of the present disclosure may be practiced without these specific details. In some instances, well-known structures and techniques are not shown in detail so as not to obscure the descriptions.

In order to simplify the present disclosure and facilitate understanding one or more aspect of the present disclosure, the various features of the present disclosure are sometimes combined together into a single embodiment, drawing or description thereof in the above descriptions of the exemplary embodiments of the present disclosure. However, the disclosed device should not be construed as reflecting the intention that the claimed invention requires more features than those specifically recited in the appended claims.

Those skilled in the art will appreciate that the components of the devices in the embodiments may be adaptively changed and placed in one or more different devices than the embodiments. The components in the embodiments may be combined into one component and, in addition, they may be divided into a plurality of sub-components. In addition to the mutual exclusion of at least some of such features, all of the features disclosed in this specification, including the appended claims, the abstract and the drawings, and all components of any device so disclosed may be combined. Each feature disclosed in the specification, including the appended claims, the abstract and the drawings, may be replaced by the alternative features that provide the same, equivalent or similar purpose, unless otherwise explained.

In addition, those skilled in the art will appreciate that, although some embodiments described herein include certain features that are included in other embodiments, combinations of features in different embodiments are intended to be within the scope of the present disclosure and may form different embodiments. For example, in the following claims, any one of the claimed embodiments may be used in any combination. Various components in the embodiments of the present disclosure may be implemented in hardware or in a combination thereof.

It should be noted that the above-described embodiments are illustrative of the present disclosure and are not intended to limit the scope of the present disclosure, and those skilled in the art can devise alternative embodiments without departing from the scope of the appended claims. In the claims, any reference signs placed between parentheses shall not be construed as a limitation. The word "comprising" or "including" does not exclude the presence of a component or assembly that is not listed in the claims. The word "a" or "an" preceding a component or assembly does not exclude the presence of a plurality of such components or assemblies. The present disclosure can be implemented by means of a device including several distinct components. In the claims enumerating several components, several of these components may be embodied by the same component item. The use of the words "first", "second" and "third" does not indicate any order, and these words may be interpreted as names of the components.

The above descriptions are only optional embodiments of the present disclosure, and are not intended to limit the present disclosure in any way. Any modifications, equivalent changes and variants made to the above embodiments according to the technical spirit of the present disclosure are still within the scope of the disclosed technical solution.

What is claimed is:

1. An array substrate comprising a display region and a peripheral wiring region, wherein the array substrate comprises:
    a base substrate;
    a peripheral circuit in the peripheral wiring region and on the base substrate; and
    an electrostatic shielding layer disposed over the peripheral circuit and the base substrate,
    wherein the electrostatic shielding layer comprises:
    a first conductive layer on a side of the peripheral circuit away from the base substrate;
    an insulating layer on the first conductive layer; and
    a second conductive layer on the insulating layer, the second conductive layer comprising a connecting portion electrically connected to the first conductive layer, wherein the connecting portion is annularly disposed around a periphery of the display region, and
    wherein an enclosed space is formed between the first conductive layer and the second conductive layer and is filled with at least a part of the insulating layer.

2. The array substrate of claim 1, wherein an orthographic projection of the connecting portion on the base substrate is annular.

3. The array substrate of claim 1, wherein a groove is formed in the insulating layer to expose the first conductive layer, and at least a part of the connecting portion is located in the groove to be electrically connected to the first conductive layer.

4. The array substrate of claim 1, further comprising a display circuit in the display region,
    wherein the display circuit comprises a first functional electrode in the same layer as the first conductive layer.

5. The array substrate of claim 4, wherein the display circuit further comprises a second functional electrode in the same layer as the second conductive layer.

6. The array substrate of claim 5, wherein the second conductive layer is isolated from the second functional electrode, and the second functional electrode comprises a plurality of sub-electrodes spaced apart from each other.

7. The array substrate of claim 5, wherein the first functional electrode is one of a pixel electrode and a common electrode, and the second functional electrode is the other of the pixel electrode and the common electrode.

8. The array substrate of claim 1, further comprising an electrostatic discharge circuit electrically connected to the electrostatic shielding layer.

9. The array substrate of claim 8, wherein the electrostatic discharge circuit comprises a first electrostatic discharge site and a second electrostatic discharge site that are spaced apart from each other, and
    a combined orthographic projection of the first electrostatic discharge site, the second electrostatic discharge site and the connecting portion on the base substrate is annular.

10. The array substrate of claim 9, wherein the combined orthographic projection of the first electrostatic discharge site, the second electrostatic discharge site and the connecting portion on the base substrate is a closed loop.

11. A display device comprising the array substrate of claim 1.

12. A method for manufacturing an array substrate comprising a display region and a peripheral wiring region, wherein the method comprises:
    providing a base substrate;
    forming a peripheral circuit on the base substrate and in the peripheral wiring region; and forming an electrostatic shielding layer disposed over the peripheral circuit and the base substrate;

wherein the step of forming the electrostatic shielding layer disposed over the peripheral circuit and the base substrate comprises:

forming a first conductive layer on the side of the peripheral circuit away from the base substrate;

forming an insulating layer on the first conductive layer; and forming a second conductive layer on the insulating layer in such a way that the second conductive layer comprises a connecting portion electrically connected to the first conductive layer, wherein the connecting portion is annularly disposed around a periphery of the display region;

wherein an enclosed space is formed between the first conductive layer and the second conductive layer and is filled with at least a part of the insulating layer.

13. The method of claim 12, wherein an orthographic projection of the connecting portion on the base substrate is annular.

14. The method of claim 12, wherein the step of forming the second conductive layer on the insulating layer in such a way that the second conductive layer comprises the connecting portion electrically connected to the first conductive layer comprises:

forming a groove in the insulating layer to expose the first conductive layer; and forming the second conductive layer on the insulating layer with the groove such that at least a part of the connecting portion of the second conductive layer is formed in the groove to be electrically connected to the first conductive layer.

15. The method of claim 12, wherein the step of forming the first conductive layer on the side of the peripheral circuit away from the base substrate comprises:

forming a first functional electrode of a display circuit in the display region and forming the first conductive layer on the side of the peripheral circuit away from the base substrate through the same first patterning process.

16. The method of claim 15, wherein the step of forming the second conductive layer on the insulating layer comprises:

forming a second functional electrode of the display circuit in the display region and forming the second conductive layer on the insulating layer through the same second patterning process.

17. The method of claim 16, wherein the first functional electrode is one of a pixel electrode and a common electrode, and the second functional electrode is the other of the pixel electrode and the common electrode.

* * * * *